(12) United States Patent
Yamamoto et al.

(10) Patent No.: US 7,616,060 B2
(45) Date of Patent: Nov. 10, 2009

(54) POWER AMPLIFIER

(75) Inventors: Kazuya Yamamoto, Tokyo (JP); Miyo Miyashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 38 days.

(21) Appl. No.: 12/131,959

(22) Filed: Jun. 3, 2008

(65) Prior Publication Data

US 2009/0174484 A1 Jul. 9, 2009

(30) Foreign Application Priority Data

Jan. 7, 2008 (JP) ............................... 2008-000722

(51) Int. Cl.
*H03G 3/00* (2006.01)
(52) U.S. Cl. .................. 330/284; 330/302; 330/296
(58) Field of Classification Search ................. 330/284, 330/302, 296
See application file for complete search history.

(56) References Cited

U.S. PATENT DOCUMENTS

| | | | |
|---|---|---|---|
| 6,351,183 B1 * | 2/2002 | Khabbaz et al. ............... 330/51 |
| 6,438,364 B1 * | 8/2002 | Waite .......................... 455/323 |
| 6,946,913 B2 | 9/2005 | Moriwaki et al. |
| 7,071,782 B2 * | 7/2006 | Delpy .......................... 330/284 |
| 7,202,736 B1 * | 4/2007 | Dow et al. .................... 330/129 |
| 7,230,488 B2 * | 6/2007 | Tsuruya ....................... 330/276 |
| 7,245,890 B2 * | 7/2007 | Kumagawa et al. ......... 455/130 |
| 2003/0218500 A1 | 11/2003 | Yamamoto et al. |
| 2007/0053136 A1 | 3/2007 | Yamamoto et al. |
| 2008/0174356 A1 | 7/2008 | Yamamoto et al. |

FOREIGN PATENT DOCUMENTS

JP 2003-347870 A 12/2003
JP 2007-74028 A 3/2007

* cited by examiner

*Primary Examiner*—Patricia Nguyen
(74) *Attorney, Agent, or Firm*—Leydig, Voit & Mayer, Ltd.

(57) ABSTRACT

An amplifying transistor for amplifying a radio frequency signal between an input terminal and an output terminal. The cathode of a first diode is connected to the input terminal and the anode of a second diode is connected to the output terminal. A matching and attenuating circuit is connected between the anode of the first diode and the cathode of the second diode. A matching and attenuating circuit reduces impedance mismatches on the input terminal side and the output terminal side, and attenuates the radio frequency signal. In an amplification mode, a bias circuit supplies a bias current to an amplifying transistor and a current mirror circuit turns off the first and second diodes. In an attenuation mode, the bias circuit supplies no bias current to the amplifying transistor and the current mirror circuit turns on the first and second diodes.

16 Claims, 12 Drawing Sheets

POWER AMPLIFIER

BACKGROUND OF THE INVENTION

1. Field of the Invention

The present invention relates to a power amplifier which amplifies a radiofrequency (RF) signal in an amplification mode, and which attenuates an RF signal in an attenuation mode. More particularly, the present invention relates to a power amplifier capable of increasing the degree of design freedom by reducing the minimum operating voltage and reducing input and output impedance mismatches in the attenuation mode.

2. Background Art

In recent years, GaAs-HBT (heterojunction bipolar transistor) power amplifiers have been widely used as a power amplifier for portable telephones for code division multiple access (CDMA) and a power amplifier for wireless LANs.

Because GaAs-HBTs do not require a negative gate bias voltage, they can operate by being powered from a single power supply and obtaining uniform device characteristics in comparison with GaAs-FETs. Therefore GaAs-HBTs have been frequently applied to GaAs power amplifiers for portable telephones, wireless LANs, etc.

In a case where an RF switch device is formed by an ordinary GaAs-HBT process, however, a switch capable of turning on a channel only by applying a gate voltage cannot be formed. Therefore a switch using a base-collector-junction diode (BC diode) having a junction akin to a p-i-n junction is used (see, for example, Japanese Patent Laid-Open No. 2003-347870).

A step attenuation function can be realized with an attenuator using a base-collector diode (hereinafter referred to as "BC diode"). FIG. 20 is a block diagram showing a three-stage power amplifier in which an attenuator having a step attenuation function is inserted in an amplifying stage. Power amplifiers A1 to A3 forming three stages are provided. An attenuator ATT having a step attenuation function is provided between the first-stage power amplifier A1 and the second-stage power amplifier A2.

FIG. 21 is a circuit diagram showing an example of a conventional attenuator having a step attenuation function. A BC diode D1 has its anode connected to an input terminal IN and has its cathode connected to an output terminal OUT. A control terminal Vc1 is connected to the anode of the BC diode D1 via an RF blocking inductor L1 and a resistor R1. A resistor R3 and an RF blocking inductor L3 are connected in series between the cathode of the BC diode D1 and a grounding point. A resistor R01, a capacitor C1 and a resistor R02 are provided between the anode and the cathode of the BC diode D1. A BC diode D2 has its cathode connected to a connection point between the capacitor C1 and the resistor R02 and has its anode grounded via a capacitor C2. A control terminal Vc2 is connected to the anode of the BC diode D2 via an RC blocking inductor L2 and a resistor R2.

The operation of the attenuator shown in FIG. 21 will be described. When a voltage equal to or higher than the ON voltage of the BC diode D1 is applied to the control terminal Vc1 while a voltage lower than the ON voltage of the BC diode D2 (including a negative bias) is applied to the control terminal Vc2, the attenuator is set in a pass-through state in which a current flows through a path formed by the resistor R1, the BC diode D1 and the resistor R3 and, therefore, an RF signal input from the input terminal IN is transmitted directly to the output terminal OUT. When a voltage lower than the ON voltage of the BC diode D1 is applied to the control terminal Vc1 while a voltage equal to or higher than the ON voltage of the BC diode D2 is applied to the control terminal Vc2, the attenuator is set in an attenuating state in which a current flows through a path formed by the resistor R2, the BC diode D2, the resistor R02 and the resistor R3 and, therefore, an RF signal input from the input terminal IN is transmitted to the output terminal OUT while being attenuated.

FIG. 22 is a circuit diagram showing another example of a conventional attenuator having a step attenuation function. A BC diode D1 has its anode connected to an input terminal IN and has its cathode connected to an output terminal OUT. A control terminal Vc1 is connected to the anode of the BC diode D1 via an RF blocking inductor L1. A BC diode D2 has its anode connected to the cathode of the BC diode D1 and has its cathode connected to the anode of the BC diode D1 via a capacitor C1.

One end of a resistor R01 is connected to the cathode of the BC diode D2, and one end of a resistor R02 is connected to the cathode of the BC diode D1 via a capacitor C2. A BC diode D3 has its anode connected to the other ends of the resistors R01 and R02 via a capacitor C3, and a BC diode D4 has its cathode connected to the other ends of the resistors R01 and R02 via a capacitor C4. One end of a capacitor C5 is connected to the cathode of the BC diode D3 and to the anode of the BC diode D4, while the other end of the capacitor C5 is grounded.

A control terminal Vc2 is connected to the cathode of the BC diode D2 via an RF blocking inductor L2, a resistor R2 and the resistor R01. A control terminal Vc3 is connected to the anode of the BC diode D3 via an RF blocking inductor L3 and a resistor R3. A control terminal Vc4 is connected to the cathode of the BC diode D4 via an RF blocking inductor L4 and a resistor R4.

The operation of the attenuator shown in FIG. 22 will be described. When a voltage equal to or higher than 2 Vbi (Vbi: a barrier potential of the BC diode, ordinarily about 1.2 V) is applied to the control terminals Vc1 and Vc4 while 0 V is applied to the control terminals Vc2 and Vc3, the BC diodes D1 and D2 are on, the BC diodes D3 and D4 are off, and the attenuator is in a pass-through state. When 0 V is applied to the control terminals Vc1 and Vc4 while a voltage equal to or higher than 2 Vbi is applied to the control terminals Vc2 and Vc3, the BC diodes D1 and D2 are off, the BC diodes D3 and D4 are on, and the attenuator is in an attenuating state.

FIG. 23 is a diagram showing power pass characteristics of the attenuators shown in FIGS. 21 and 22. The attenuator shown in FIG. 22 can have an allowable input power four times or more (6 dB or more) higher than that of the attenuator shown in FIG. 21 with respect to the same operating current.

A step attenuation function may be realized by providing a bypass circuit in an amplifying stage other than inserting an attenuator having a step attenuation function in an amplifying stage as described above. FIG. 24 is a block diagram showing a three-stage power amplifier having a bypass circuit in an amplifying stage. Power amplifiers A1 to A3 forming three stages are respectively provided with bias circuits B1 to B3 for supplying bias currents to the power amplifiers A1 to A3. Control voltages are supplied to the bias circuits B1 and B3 from a control terminal Vref, and a control voltage is supplied to the bias circuit B2 from a control circuit Vref2. A bypass circuit constituted by a resistor Rf2 and a capacitor Cf2 is provided as a bypass around the second-stage power amplifier A2.

FIG. 25 is a circuit diagram showing the power amplifier, the bias circuit and the bypass circuit in the second stage shown in FIG. 24. The power amplifier has a collector power supply terminal Vcc, an amplifying transistor Tr, an inductor L and a capacitor C. The bias circuit has a collector power supply terminal Vcb2, transistors Trb1 to Trb5 and resistors Rbb1 to Rbb7. The bypass circuit constituted by a resistor Rf2 and a capacitor Cf2 is provided between the base and the collector of the amplifying transistor Tr of the power amplifier.

The operation of the circuit shown in FIG. 24 will be described. When 3 V for example is applied to the control terminals Vref and Vref2, all the power amplifiers A1 to A3 are supplied with bias currents to perform a normal amplifying operation. When 0 V is applied to the control terminal Vref2, only the second-stage power amplifier A2 is supplied with no bias current and is off. In this state, an RF signal is transmitted to the third-stage power amplifier A3 via the bypass circuit (resistor Rf2 and capacitor Cf2). The amount of attenuation of the RF signal thus caused is determined by setting the resistance value of the resistor Rf2 and the capacitance value of the capacitor Cf2 to suitable values.

For example, if the gain of the power amplifier A2 when 3 V is applied to the control terminal Vref2 is 10 dB; the gains of the power amplifiers A1 and A3 are 20 dB; and the gain of the signal passed through the bypass circuit (resistor Rf2 and capacitor Cf2) when 0 V is applied to the control terminal Vref2 is −10 dB, two states of the circuit shown in FIG. 24: one in which the gain of the circuit is 30 dB and one in which the gain of the circuit is 10 dB can be realized according to the voltage applied to the control terminal Vref2. That is, a step attenuation function to select the gain from 0 dB and 20 dB can be realized by means of the power amplifier A2 and the bypass circuit.

The circuit shown in FIG. 24 turns off the second-stage power amplifier A2 in the attenuation mode. Therefore the consumption current in the attenuation mode can be reduced relative to that in the circuit shown in FIG. 20. However, even in a state where the power amplifier A2 is off, the amplifying transistor Tr changes from the off state to the on state by its self-biasing when high power is input from the initial-stage power amplifier A1. This change corresponds to a state in which the insertion loss is changed as shown in FIG. 23. Therefore the allowable input power at which the attenuating state can be maintained depends on the size of the amplifying transistor Tr (the emitter total junction area) and the off-state base bias voltage. On the other hand, in the circuit shown in FIG. 20, all the power amplifiers A1 to A3 are on and, therefore, the allowable input power depends only on the bias currents and bias voltages with respect to the passing and attenuating states of the attenuator.

SUMMARY OF THE INVENTION

In the attenuator shown in FIG. 22, if the capacitors C1 to C5 are formed on a GaAs chip, the capacitance values of the capacitors are comparatively small. Accordingly, the impedance values of the capacitors C1 to C5 in the operating frequency range also become a factor in determining the amount of attenuation. Also, there is a problem that if a drive circuit for the attenuator is also formed by GaAs-HBTs, the minimum operating voltage is theoretically 3 Vbi or higher (about 3.6 to 3.9 V) because of a need to supply voltages to the control terminals Vc1 and Vc4 through the emitters of the HBTs. In contrast, the entire circuit shown in FIGS. 24 and 25, including the bias circuit, is capable of operating at a voltage of 2 Vbi or higher, has a minimum operating voltage of 2 Vbi and can operate at 3 V.

The circuit shown in FIGS. 24 and 25 has problems described below. First, a large impedance mismatch can occur easily between the first and second stages and between the second and third stages when the second-stage power amplifier A2 is turned off. This is because each of the matching circuits between the first and second stages and between the second and third stages is configured only of passive elements, and because this configuration makes impedance matching both in the amplification mode and in the attenuation mode difficult. If an impedance mismatch between the stages is large, it easily becomes a cause of oscillation of the amplifier when the load changes and generation of a reflection gain, which is undesirable to the operation.

Also, since the resistance Rf2 and the capacitor Cf2 operate as a feedback circuit in the amplification mode, design of the power amplifier and design of the bypass circuit cannot be performed independently of each other. That is, factors including the transistor size of the power amplifier and the amount of attenuation by the bypass circuit cannot be freely designed.

In view of the above-described problems, an object of the present invention is to provide a power amplifier capable of reducing the minimum operating voltage, reducing input and output impedance mismatches in an attenuation mode and increasing the degree of design freedom.

According to one aspect of the present invention, A power amplifier comprises: an amplifying transistor which has its base connected to an input terminal via a first capacitor and has its collector connected to an output terminal, and which amplifies a radiofrequency signal; a bias circuit which supplies a bias current to the base of the amplifying transistor; a first diode having its cathode connected to the input terminal via a second capacitor; a second diode having its anode connected to the output terminal via a third capacitor; a matching and attenuating circuit which is connected between the anode of the first diode and the cathode of the second diode, which reduces an impedance mismatches on the input terminal side and the output terminal side, and which attenuates the radiofrequency signal; a first inductor connected between the anode of the second diode and a power supply terminal; and a current mirror circuit which is connected to the cathode of the first diode via a second inductor, and which drives the first and second diodes, wherein, in an amplification mode, the bias circuit supplies a bias current to the amplifying transistor and the current mirror circuit turns off the first and second diodes, and wherein, in an attenuation mode, the bias circuit supplies no bias current to the amplifying transistor and the current mirror circuit turns on the first and second diodes.

The present invention reduces the minimum operating voltage, reduces input and output impedance mismatches in the attenuation mode and increases the degree of design freedom.

Other and further objects, features and advantages of the invention will appear more fully from the following description.

DETAILED DESCRIPTION OF THE PREFERRED EMBODIMENTS

First Embodiment

Figure 1:
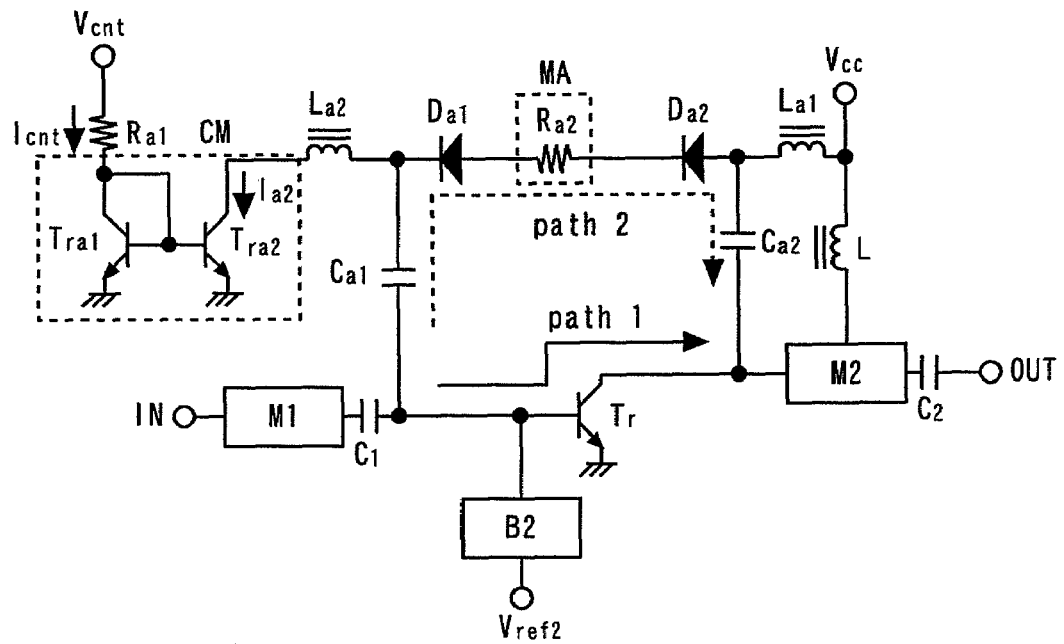
FIG. 1 is a circuit diagram showing a power amplifier according to a first embodiment of the present invention.

FIG. 1 is a circuit diagram showing a power amplifier according to a first embodiment of the present invention. This power amplifier is formed by a GaAs-HBT process.

An amplifying transistor Tr which amplifies an RF signal has its base connected to an input terminal IN via an input matching circuit M1 and a capacitor C1 (first capacitor), has its collector connected to an output terminal OUT via an output matching circuit M2 and a capacitor C2 and has its emitter grounded. An inductor L is provided between a collector power supply terminal Vcc and the output matching circuit M2. A bias circuit B2 supplies a bias current to the base of the amplifying transistor Tr according to a voltage applied to a control terminal Vref.

The cathode of a BC diode Da1 (first diode) is connected to the input terminal IN via a capacitor Ca1 (second capacitor), the capacitor C1 and the input matching circuit M1. The anode of a BC diode Da2 (second diode) is connected to the output terminal OUT via a capacitor Ca2 (third capacitor), the output matching circuit M2 and the capacitor C2.

A matching and attenuation circuit MA is connected between the anode of the BC diode Da1 and the cathode of the BC diode Da2. In this embodiment, the matching and attenuating circuit MA has a resistor Ra2 connected between the anode of the BC diode Da1 and the cathode of the BC diode Da2. The matching and attenuating circuit MA reduces impedance mismatches on the input terminal IN side and the output terminal OUT side and attenuates an RF signal according to the resistance value of the resistor Ra2.

An inductor La1 (first inductor) is connected between the anode of the BC diode Da2 and the collector power supply terminal Vcc. A current mirror circuit CM is connected to the cathode of the BC diode Da1 via an inductor La2 (second inductor). A resistor Ra1 (first resistor) produces a reference current Icnt for the current mirror circuit CM according to a voltage applied to a control terminal Vcnt. The current mirror circuit CM has transistors Tra1 and Tra2. The transistor Tra1 has its base and collector connected to the resistor Ra1 and has its emitter grounded. The transistor Tra2 has its base connected to the base of the transistor Tra1, its collector connected to the inductor La2 and its emitter grounded. The current mirror circuit CM drives the BC diodes Da1 and Da2 by causing a current to flow through the BC diodes Da1 and Da2 according to the reference current Icnt.

The operation of the circuit shown in FIG. 1 will be described. When, for example, 3 V is applied to the control terminal Vref2; 3V to the collector power supply terminal Vcc; and 0 V to the control terminal Vcnt (in an amplification mode), the bias circuit B2 supplies a bias current to the amplifying transistor Tr. Reference current Icnt does not flow. Also, bias current Ia2 does not flow through the BC diodes Da1 and Da2. That is, the current mirror circuit CM turns off the BC diodes Da1 and Da2. Then an RF signal is transmitted via a path 1 and amplified by the amplifying transistor Tr. At this time, since the BC diodes Da1 and Da2 are off, substantially no leak of the RF signal to a path 2 exists.

When 0V and 3V are applied to the control terminal Vref2 and the control terminal Vcnt, respectively (in an attenuation mode), the bias circuit B2 supplies no bias current to the amplifying transistor Tr. Reference current Icnt flows and, therefore, bias current Ia2 also flows through the BC diodes Da1 and Da2. That is, the current mirror circuit CM turns on the BC diodes Da1 and Da2. Then the RF signal is transmitted via a path 2 and attenuated by the resistor Ra2. If the inductance values of the inductors LA1 and La2 are set to suitable values, changes in reflection loss in the amplifying and attenuating operations as observed in seeing of the amplifying transistor Tr side from the input terminal IN and the output terminal OUT are reduced.

As described above, the matching and attenuating circuit MA can reduce impedance mismatches on the input terminal IN side and the output terminal OUT side and, hence, input and output impedance mismatches in the attenuation mode.

Since the BC diodes Da1 and Da2 are turned off in the amplifying mode, the influence of the bypass circuit on the power amplifier can be largely reduced. In this way, design of the power amplifier and design of the bypass circuit can be performed independently of each other. That is, factors including the transistor size of the power amplifier and the amount of attenuation by the bypass circuit can be freely designed.

Figure 25:
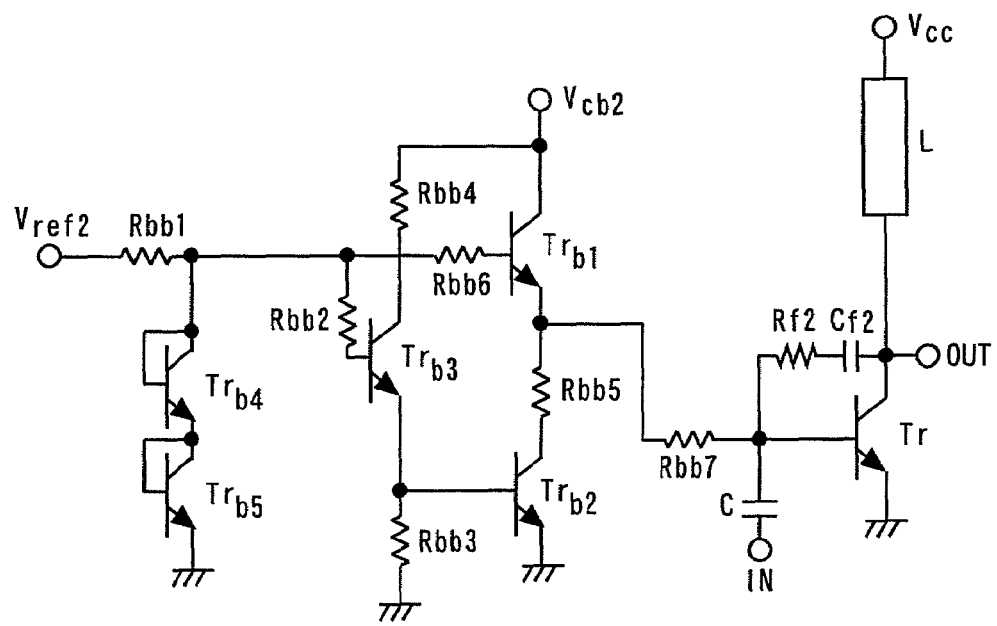
FIG. 25 is a circuit diagram showing the power amplifier, the bias circuit and the bypass circuit in the second stage shown in FIG. 24.

Since the BC diodes Da1 and Da2 are driven by the current mirror circuit CM, selection between the on and off states of the BC diodes Da1 and Da2 (i.e., the attenuation mode and the amplification mode) can be made by using the positive voltage or 0 V applied to the control voltage terminal Vcnt. The minimum operating voltage is determined by the sum (2 Vbi+Vce) of the voltage Vbi of the two BC diodes Da1 and Da2 and the on-voltage Vce between the collector and emitter of the amplifying transistor Tr. Therefore the minimum operating voltage can be reduced to about 2.6 to 2.8 V. However, since the bypass circuit is operated by causing a current to flow through the BC diodes Da1 and Da2, the operating current in the attenuation mode is increased in comparison with the conventional circuit (FIG. 25).

Second Embodiment

Figure 2:
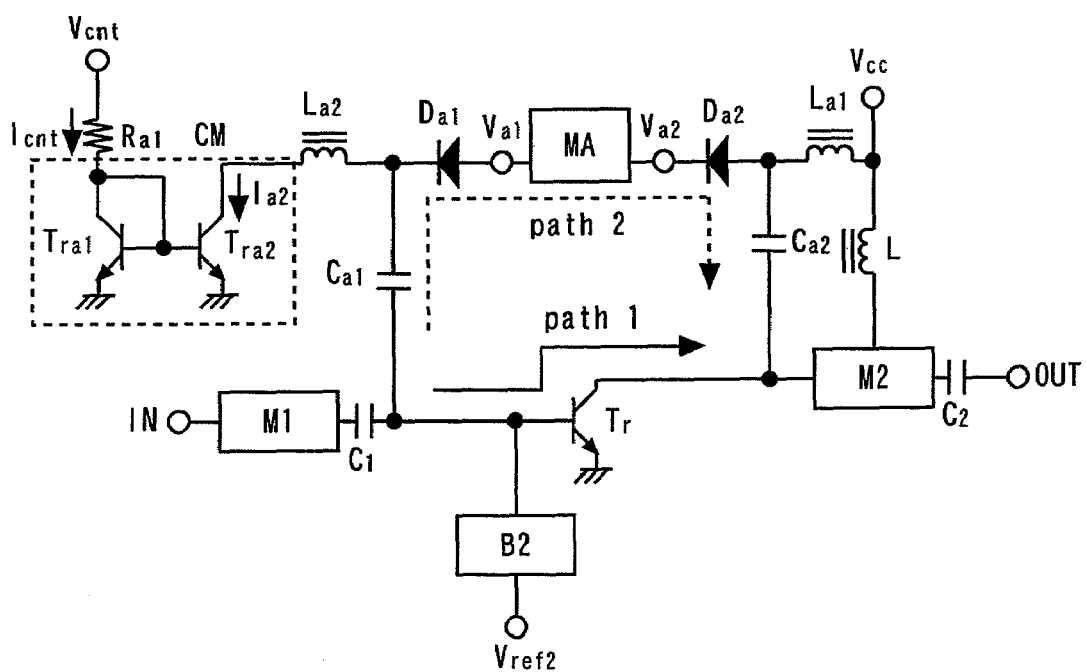
FIG. 2 is a circuit diagram showing a power amplifier according to a second embodiment of the present invention.

FIG. 2 is a circuit diagram showing a power amplifier according to a second embodiment of the present invention. The second embodiment differs from the first embodiment in the configuration of the matching and attenuating circuit MA. The circuit configuration of the matching and attenuating circuit according to the second embodiment will be described. It is assumed here that the matching and attenuating circuit MA has a terminal Va1 connected to the anode of the BC diode Da1 and a terminal Va2 connected to the cathode of the BC diode Da2.

Figure 3:
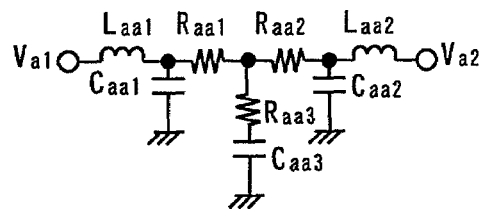
FIG. 3 is a circuit diagram showing a first example of the matching and attenuating circuit according to the second embodiment.

FIG. 3 is a circuit diagram showing a first example of the matching and attenuating circuit according to the second embodiment. An inductor Laa1, a resistor Raa1, a resistor Raa2 and an inductor Laa2 are connected in series between the terminal Va1 and the terminal Va2. A capacitor Caa1 is connected between an inductor Laa1-resistor Raa1 connection point and a grounding point. A resistor Raa3 and a capacitor Caa3 are connected in series between a resistor Raa1-resistor Raa2 connection point and a grounding point. A capacitor Caa2 is connected between a resistor Raa2-inductor Laa2 connection point and a grounding point.

Figure 4:
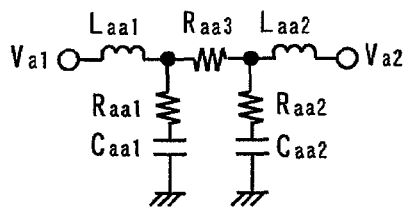
FIG. 4 is a circuit diagram showing a second example of the matching and attenuating circuit according to the second embodiment.

FIG. 4 is a circuit diagram showing a second example of the matching and attenuating circuit according to the second embodiment. An inductor Laa1, a resistor Raa3 and an inductor Laa2 are connected in series between the terminal Va1 and the terminal Va2. A resistor Raa1 and a capacitor Caa1 are connected in series between an inductor Laa1-resistor Raa3 connection point and a grounding point. A resistor Raa2 and a capacitor Caa2 are connected in series between a resistor Raa3-inductor Laa2 connection point and a grounding point.

Figure 5:
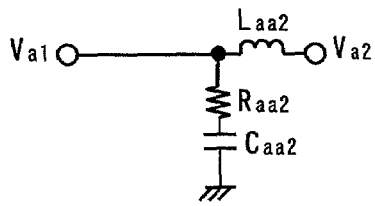
FIG. 5 is a circuit diagram showing a third example of the matching and attenuating circuit according to the second embodiment.

FIG. 5 is a circuit diagram showing a third example of the matching and attenuating circuit according to the second embodiment. An inductor Laa2 is connected between the terminal Va1 and the terminal Va2. A resistor Raa2 and a capacitor Caa2 are connected in series between one end of the inductor Laa2 and a grounding point.

The matching and attenuating circuit MA is configured as described above to realize both an impedance matching function and an attenuating function in the attenuation mode with improved reliability in comparison with the first embodiment. Other effects, which are the same as those of the first embodiment, can also be obtained.

Third Embodiment

Figure 6:
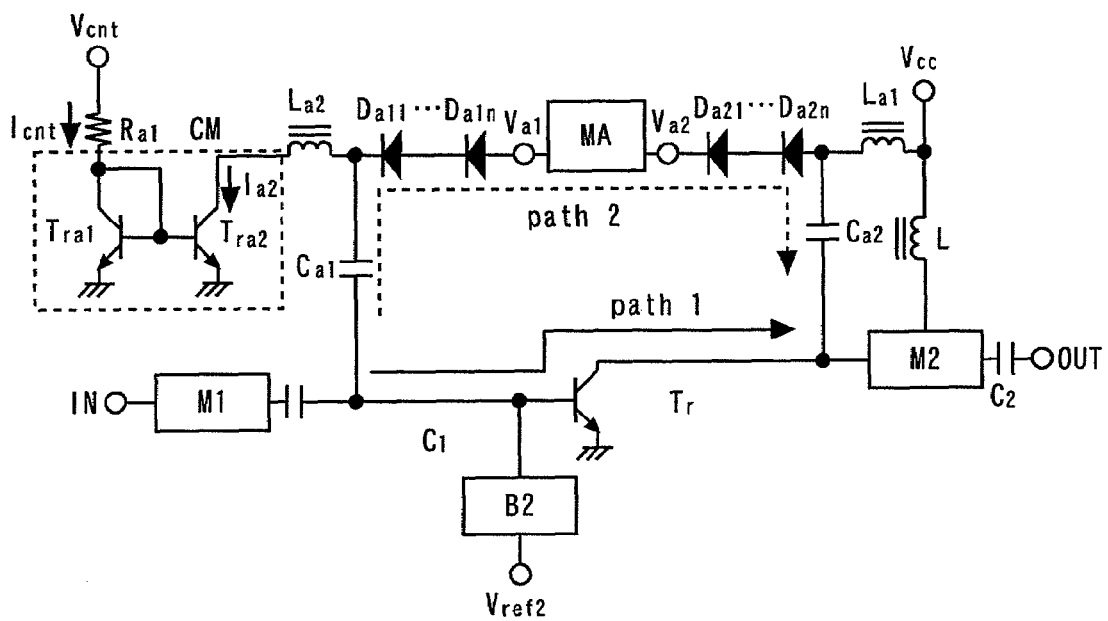
FIG. 6 is a circuit diagram showing a power amplifier according to a third embodiment of the present invention.

FIG. 6 is a circuit diagram showing a power amplifier according to a third embodiment of the present invention. The third embodiment differs from the second embodiment in that each of the first and second diodes comprises a plurality of diodes connected in series. That is, a plurality of BC diodes Da11 to Da1n are connected in series as the first diode in place of the BC diode Da1, and a plurality of BC diodes Da21 to Da2n are connected in series as the second diode in place of the BC diode Da2. In this way, insufficiency of isolation of the path 2 in the amplification mode can be remedied. Other effects, which are the same as those of the second embodiment, can also be obtained.

Fourth Embodiment

Figure 7:
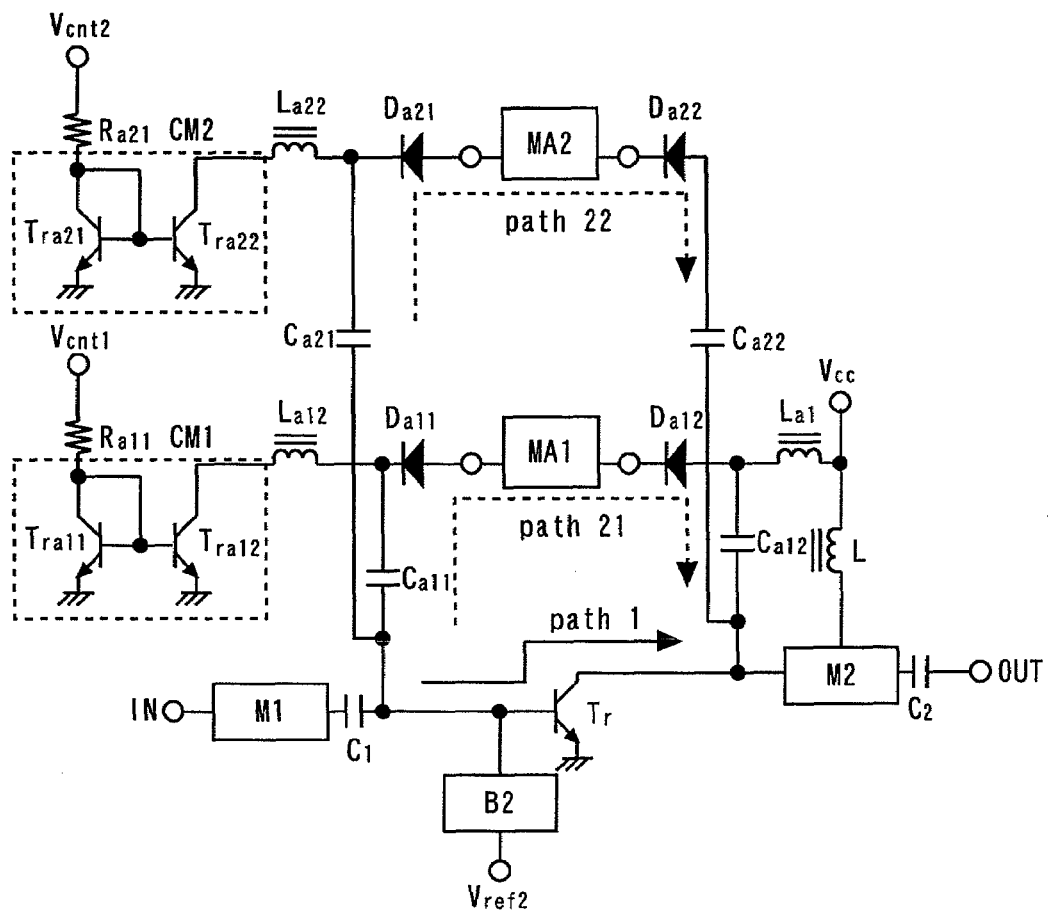
FIG. 7 is a circuit diagram showing a power amplifier according to a fourth embodiment of the present invention.

FIG. 7 is a circuit diagram showing a power amplifier according to a fourth embodiment of the present invention. The fourth embodiment differs from the second embodiment in that two bypass circuits each constituted by first and second diodes, a matching and attenuating circuit and a current mirror circuit are provided in parallel with each other.

One bypass circuit has BC diodes Da11 and Da12, a matching and attenuating circuit MA1, capacitors Ca11 and Ca12, an inductor La12, a resistor Ra11, a current mirror circuit CM1 and a control terminal Vcnt1. The current mirror circuit CM1 has transistors Tra11 and Tra12.

Another bypass circuit has BC diodes Da21 and Da22, a matching and attenuating circuit MA2, capacitors Ca21 and Ca22, an inductor La22, a resistor Ra21, a current mirror circuit CM2 and a control terminal Vcnt2. The current mirror circuit CM2 has transistors Tra21 and Tra22.

In the above-described configuration, the two bypass circuits can be independently controlled by controlling voltages applied to the control terminals Vcnt1 and Vcnt2. In this way, two attenuation modes in which input and output impedance mismatches are reduced can be set. Other effects, which are the same as those of the second embodiment, can also be obtained.

The configuration of the fourth embodiment is not limited to the above-described one in which two bypass circuits are provided in parallel with each other. Three or more bypass circuits may be provided in parallel with each other.

Fifth Embodiment

Figure 8:
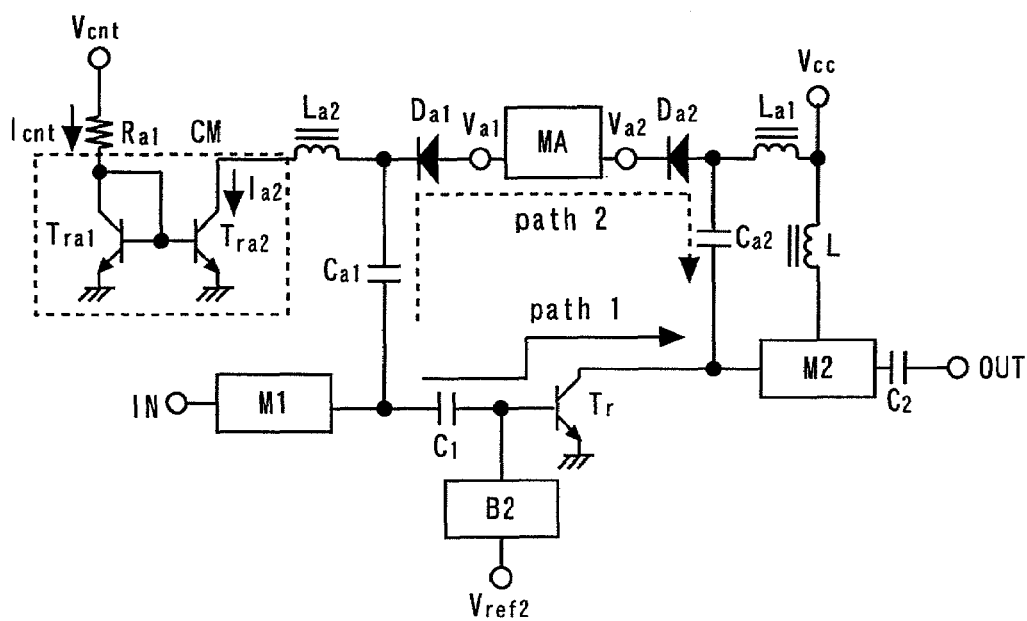
FIG. 8 is a circuit diagram showing a power amplifier according to a fifth embodiment of the present invention.

FIG. 8 is a circuit diagram showing a power amplifier according to a fifth embodiment of the present invention. The fifth embodiment differs from the second embodiment in that the cathode of the diode Da1 is connected to a connection point between the input matching circuit M1 (input terminal IN) and the capacitor C1. That is, separation between the amplifying transistor Tr side and the bypass circuit side is made at a higher impedance point in comparison with the second embodiment. In this way, setting a component constant of the matching circuit provided in the bypass circuit to a smaller value is made possible in comparison with the second embodiment, so that the layout area of this circuit can be reduced. Other effects, which are the same as those of the second embodiment, can also be obtained.

Sixth Embodiment

Figure 9:
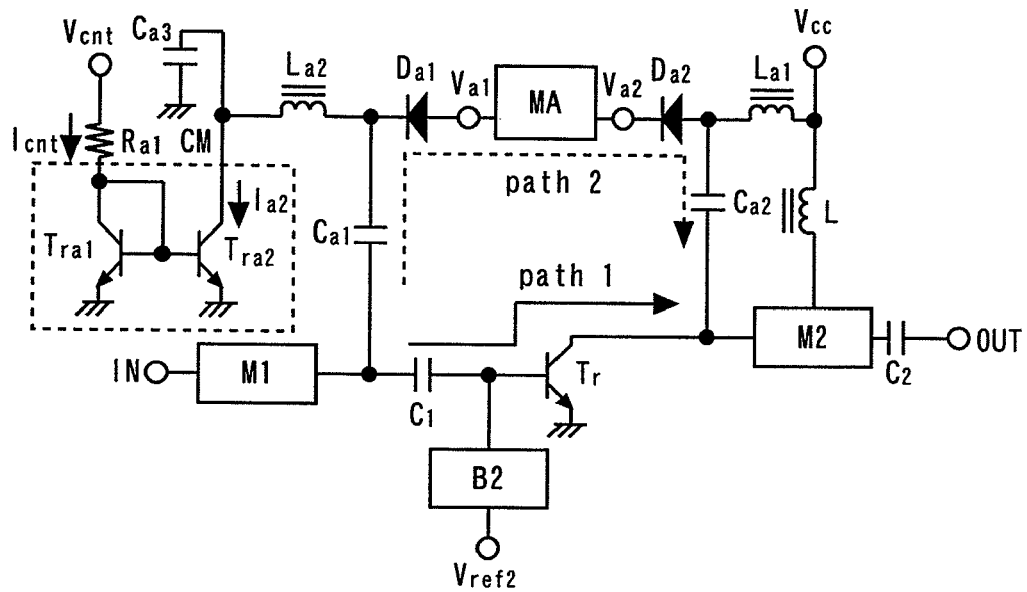
FIG. 9 is a circuit diagram showing a power amplifier according to a sixth embodiment of the present invention.

FIG. 9 is a circuit diagram showing a power amplifier according to a sixth embodiment of the present invention. The sixth embodiment differs from the fifth embodiment in that a capacitor Ca3 (fourth capacitor) is provided between an inductor La2-current mirror circuit CM connection point and a grounding point.

In a case where this circuit is formed on a GaAs chip, the inductance value of the inductor La2 cannot be sufficiently increased, so that passed power in the attenuation mode cannot be completely blocked by the inductor La2. With increase in passed power, therefore, the bias current Ia2 is increased due to rectification through the transistor Tra2, resulting in a change in amount of attenuation. The capacitor Ca3 is then provided to reduce the change in collector voltage of the transistor Tra2 due to a leak of power to the transistor Tra2, thereby limiting the change in bias current Ia2. Consequently, the change in amount of attenuation in the attenuation mode can be reduced. Other effects, which are the same as those of the fifth embodiment, can also be obtained.

Seventh Embodiment

Figure 10:
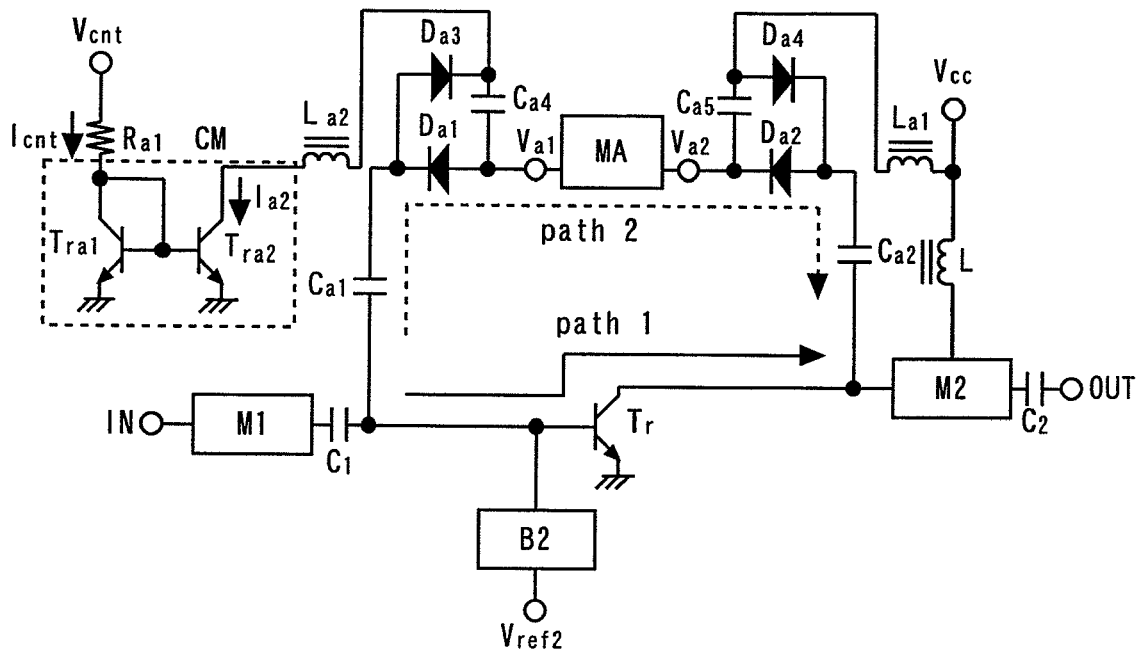
FIG. 10 is a circuit diagram showing a power amplifier according to a seventh embodiment of the present invention.

FIG. 10 is a circuit diagram showing a power amplifier according to a seventh embodiment of the present invention. The seventh embodiment differs from the second embodiment in that the first and second diodes are replaced with BC diode switches of an AC-coupled stack type. That is, a BC diode Da3 (third diode) has its anode connected to the cathode of the BC diode Da1 and has its cathode connected to the anode of the BC diode Da1. A capacitor Ca4 (fifth capacitor) is connected in parallel with the BC diode Da1 and in series with the BC diode Da3. A BC diode Da4 (fourth diode) has its anode connected to the cathode of the BC diode Da2 and has its cathode connected to the anode of the BC diode Da2. A capacitor Ca5 (sixth capacitor) is connected in parallel with the BC diode Da2 and in series with the BC diode Da4.

This configuration makes it possible to reduce the operating current in the attenuation mode. However, the number of vertically stacked diodes is increased from 2 to 4 as in the third embodiment and the minimum operating voltage is correspondingly increased. Other effects, which are the same as those of the second embodiment, can also be obtained.

Eighth Embodiment

Figure 11:
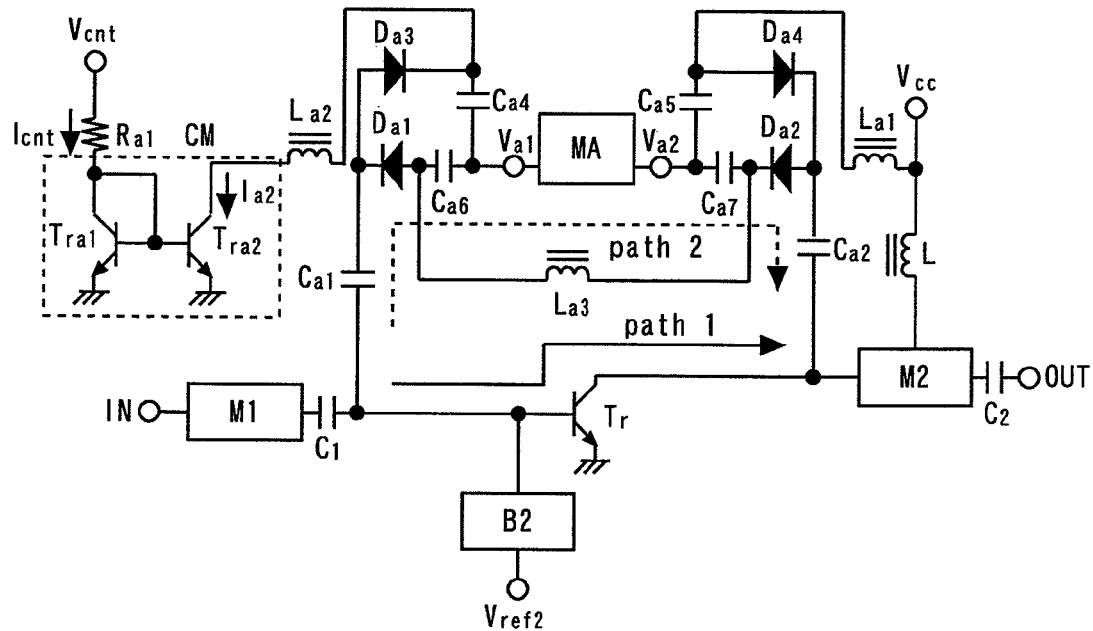
FIG. 11 is a circuit diagram showing a power amplifier according to an eighth embodiment of the present invention.

FIG. 11 is a circuit diagram showing a power amplifier according to an eighth embodiment of the present invention. The eighth embodiment differs from the seventh embodiment in that a capacitor Ca6 (seventh capacitor) and a capacitor Ca7 (eighth capacitor) are provided. The capacitor Ca6 is connected in parallel with the BC diode Da3 and in series with the BC diode Da1. The capacitor Ca7 is connected in parallel with the BC diode Da4 and in series with the BC diode Da2.

Thus, the AC-coupled stack type of BC diode switches are equally divided by the capacitor Ca4 and the capacitor Ca6 and by the capacitor Ca5 and the capacitor Ca7. Therefore the distortion characteristics in the attenuation mode can be improved in comparison with the seventh embodiment. Other effects, which are the same as those of the seventh embodiment, can also be obtained.

Ninth Embodiment

Figure 12:
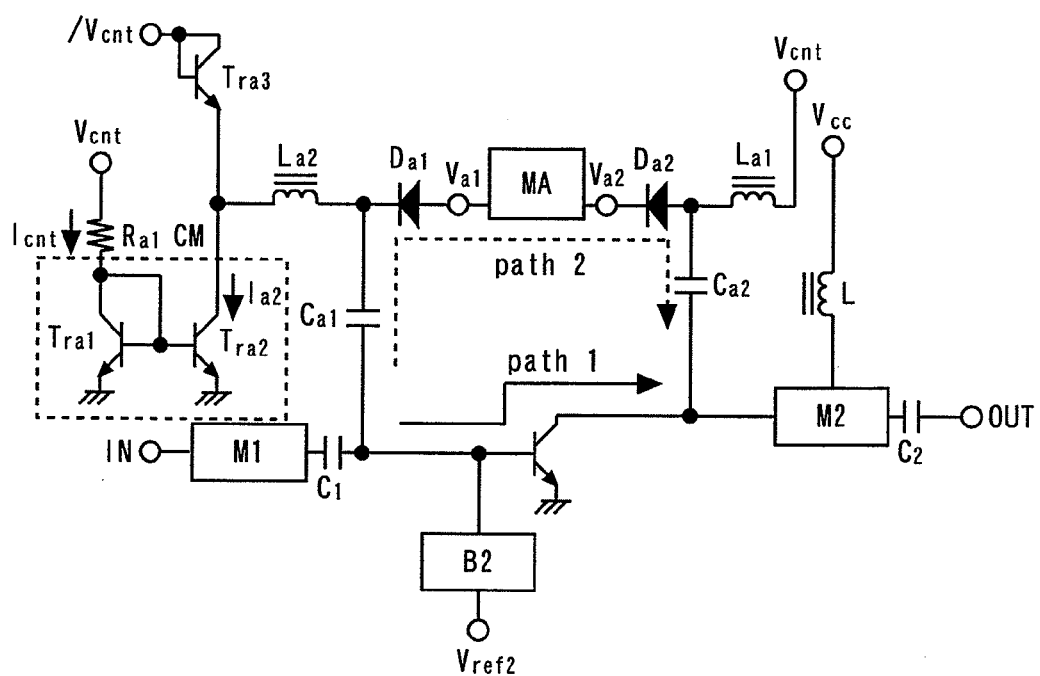
FIG. 12 is a circuit diagram showing a power amplifier according to a ninth embodiment of the present invention.

FIG. 12 is a circuit diagram showing a power amplifier according to a ninth embodiment of the present invention. The ninth embodiment differs from the second embodiment in that a control terminal /Vcnt and a transistor Tra3 are added and the inductor La1 is separated from the collector power supply terminal Vcc and connected to the control terminal Vcnt.

The transistor Tra3 has its base and collector connected to the control terminal /Vcnt and has its emitter connected to the cathode of the diode Da1. To the control terminal /Vcnt, a voltage in phase opposition to the voltage applied to the control terminal Vcnt is applied. That is, a high-level voltage is applied to the control terminal /Vcnt in the amplification mode, and a low-level voltage is applied to the control terminal /Vcnt in the attenuation mode.

In the above-described configuration, a reverse bias is forcibly applied to the diodes Da1 and Da2 in the amplification mode, thereby further reducing the influence of the junction capacitance of the diodes Da1 and Da2 on the power amplifier. While there is a need to apply a control voltage to the control terminal /Vcnt as well as to the control terminal Vcnt, the problem that the minimum operating voltage is increased with increase in the number of diodes as in the third embodiment can be solved. Other effects, which are the same as those of the second embodiment, can also be obtained.

Tenth Embodiment

Figure 13:
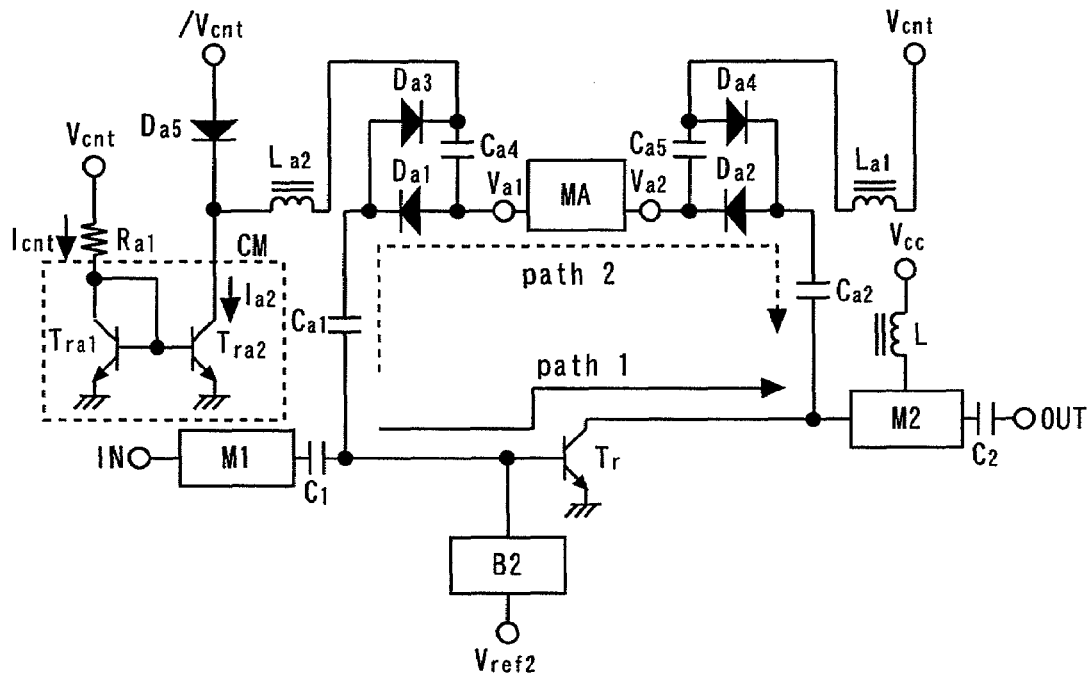
FIG. 13 is a circuit diagram showing a power amplifier according to a tenth embodiment of the present invention.

FIG. 13 is a circuit diagram showing a power amplifier according to a tenth embodiment of the present invention. The tenth embodiment differs from the ninth embodiment in that the transistor Tra3 is replaced with a BC diode Da5 (fifth diode). The BC diode Da5 has its anode connected to the control terminal /Vcnt and has its cathode connected to the cathode of the diode Da1. The BC diode Da5 is more advantageous than the transistor Tra3 because of its reduced layout area. Other effects, which are the same as those of the ninth embodiment, can also be obtained.

In the tenth embodiment, the diode section is configured in the same manner as those in the embodiments 7 and 8 to enhance the effects of the ninth and tenth embodiments in comparison with a case where the diode section is configured in the same manner as in the second embodiment. This is because the AC-coupled stack type of BC diode switch has a junction area twice that of one BC diode and ordinarily requires reducing the influence of the junction capacitance due to the reverse in practice.

Eleventh Embodiment

Figure 14:
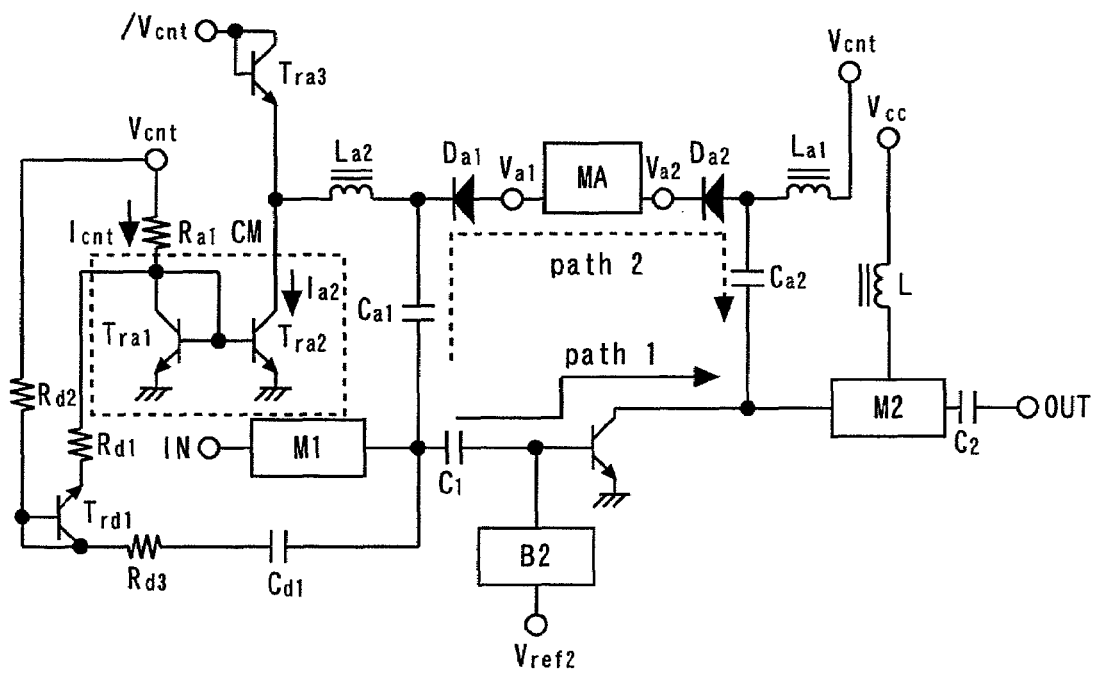
FIG. 14 is a circuit diagram showing a power amplifier according to an eleventh embodiment of the present invention.

FIG. 14 is a circuit diagram showing a power amplifier according to an eleventh embodiment of the present invention. The eleventh embodiment differs from the ninth embodiment in providing an input power detection circuit which increases the reference current Icnt for the current mirror circuit CM according to an increase in power of RF signal input to the amplifying transistor Tr.

The input power detection circuit has resistors Rd1, Rd2, and Rd3, a capacitor Cd1 and a transistor Trd1. The transistor Trd1 has its base and collector connected to the control terminal Vcnt via the resistor Rd2 and to the base of the amplifying transistor Tr via the resistor Rd3 and the capacitor Cd1. The emitter of the transistor Trd1 is connected to the collector of the transistor Tra1 via the resistor Rd1.

The bias current Ia2 is increased according to increase in input power as described above, thereby improving the allowable input power in the attenuation mode. The operation with this improvement can be realized by adding a comparatively small number of elements as described above, because the current mirror circuit CM easily current-controllable is used as a circuit for driving the first and second diodes. Other effects, which are the same as those of the second embodiment, can also be obtained.

Twelfth Embodiment

Figure 15:
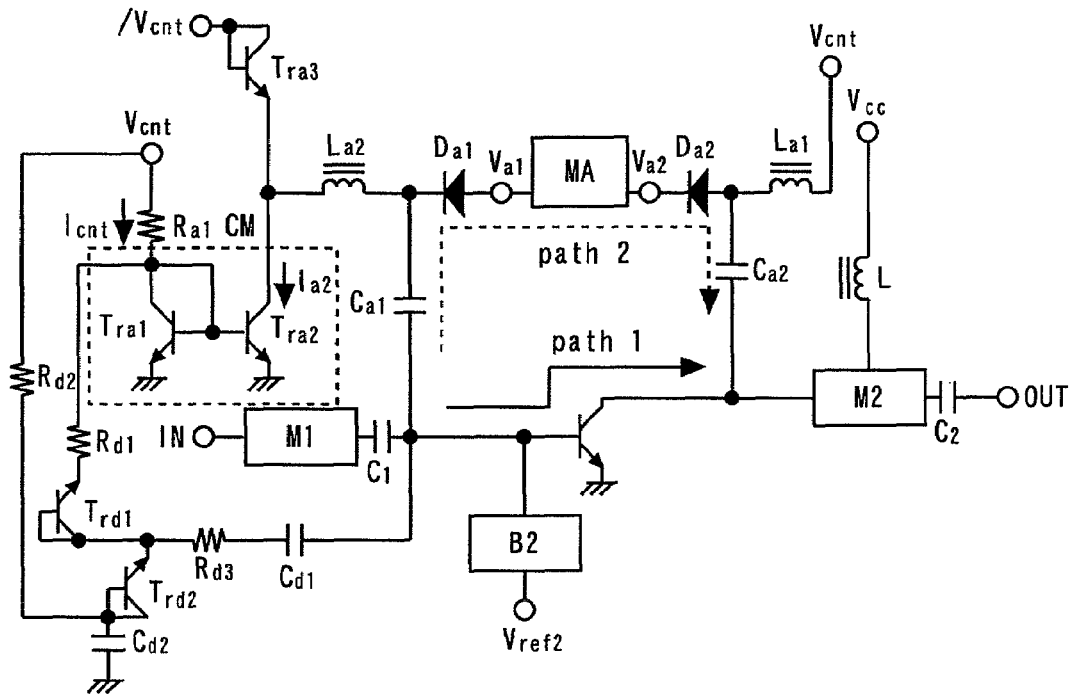
FIG. 15 is a circuit diagram showing a power amplifier according to a twelfth embodiment of the present invention.

FIG. 15 is a circuit diagram showing a power amplifier according to a twelfth embodiment of the present invention. The twelfth embodiment differs from the eleventh embodiment in that the input power detection circuit further has a transistor Trd2 and a capacitor Cd2. The transistor Trd2 has its base and collector connected to the control terminal Vcnt via the resistor Rd2 and grounded via the capacitor Cd2. This configuration enables the bias current Ia2 to be increased more largely with respect to increase in input power in the attenuation mode, thereby further improving the allowable input power in the attenuation mode. Other effects, which are the same as those of the eleventh embodiment, can also be obtained.

Thirteenth Embodiment

Figure 16:
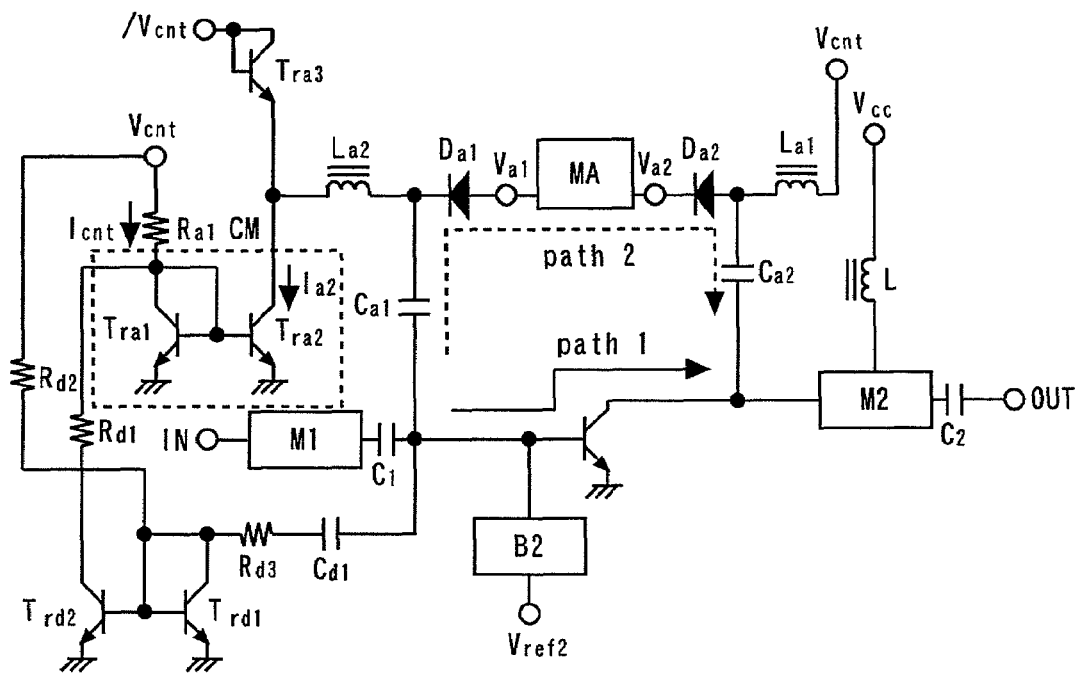
FIG. 16 is a circuit diagram showing a power amplifier according to a thirteenth embodiment of the present invention.

FIG. 16 is a circuit diagram showing a power amplifier according to a thirteenth embodiment of the present invention. The thirteenth embodiment differs from the eleventh embodiment in the configuration of the input power detection circuit. The input power detection circuit in the thirteenth embodiment is a current mirror-based detection circuit having in its detection section resistors Rd1, Re2, and Rd3, a capacitor Cd1 and transistors Trd1 and Trd2.

The transistor Trd1 has its base and collector connected to the control terminal Vcnt via the resistor Rd2 and to the base of the amplifying transistor Tr via the resistor Rd3 and the capacitor Cd1. The transistor Trd2 has its base connected to the base of the transistor Trd1 and has its collector connected to the collector of the transistor Trd1 via the resistor Rd1. The emitters of the transistors Trd1 and Trd2 are grounded.

This configuration enables the bias current Ia2 to be linearly increased with respect to input power in dBm. The increase in the bias current Ia2 is not linear in the eleventh and twelfth embodiments. Therefore the thirteenth embodiment is more advantageous than eleventh and twelfth embodiments in certain applications. Other effects, which are the same as those of the eleventh embodiment, can also be obtained.

Fourteenth Embodiment

Figure 17:
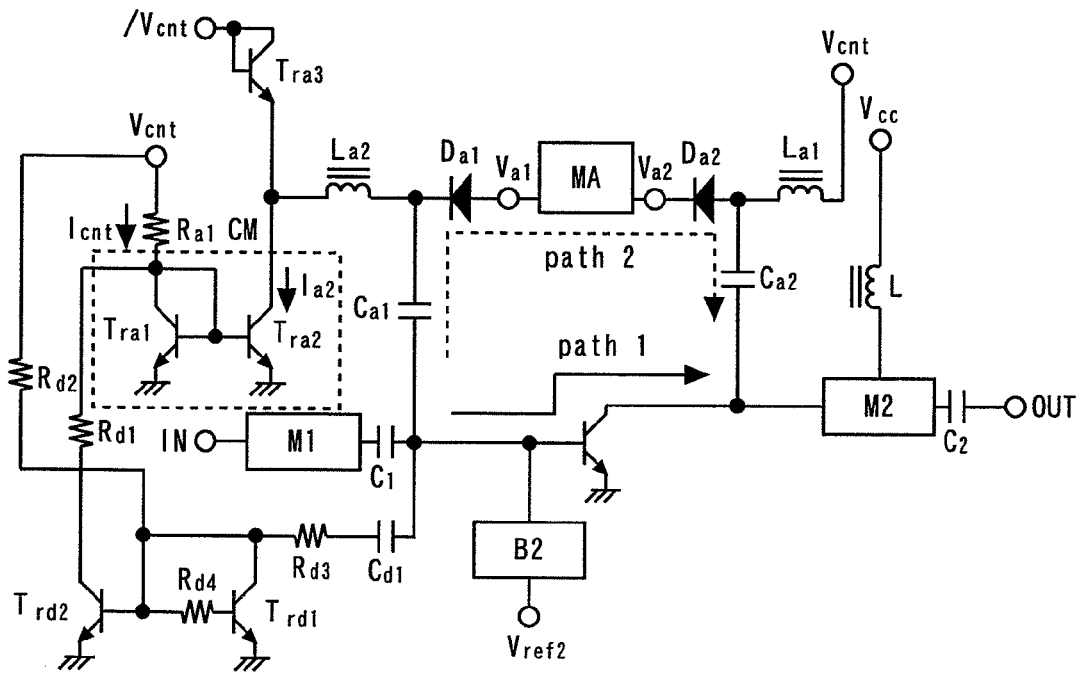
FIG. 17 is a circuit diagram showing a power amplifier according to a fourteenth embodiment of the present invention.

FIG. 17 is a circuit diagram showing a power amplifier according to a fourteenth embodiment of the present invention. The fourteenth embodiment differs from the thirteenth embodiment in that a resistor Rd4 is inserted between the base of the transistor Trd1 and the base of the transistor Trd2. This configuration is effective in reducing the frequency dependence of the detected voltage. Other effects, which are the same as those of the thirteenth embodiment, can also be obtained.

Fifteenth Embodiment

In a fifteenth embodiment of the present invention, the resistor Ra1 (first resistor) for producing reference current Icnt for the current mirror circuit CM in the second embodiment is formed of a resistor whose resistance value increases with increase in temperature. More specifically, the resistor Ra1 is formed of a base-layer resistor having a comparatively high positive temperature coefficient. With increase in temperature, the barrier voltage of the HBT decreases. Correspondingly, the reference current Icnt increases and the current Ia2 through the BC diodes Da1 and Da2 also increases. On the other hand, the resistance value of the resistor Ra1 increases with increase in temperature to limit this change in current. Other effects, which are the same as those of the second embodiment, can also be obtained.

Sixteenth Embodiment

Figure 18:
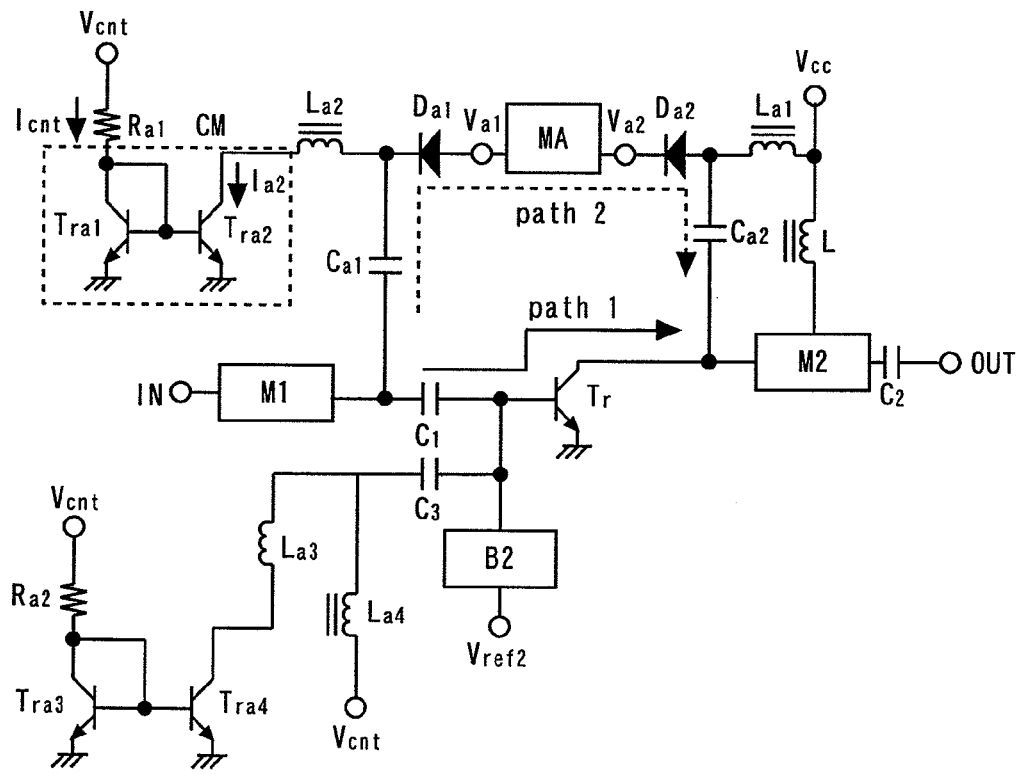
FIG. 18 is a circuit diagram showing a power amplifier according to a sixteenth embodiment of the present invention.

FIG. 18 is a circuit diagram showing a power amplifier according to a sixteenth embodiment of the present invention. The sixteenth embodiment differs from the second embodiment in that a shorting circuit having a capacitor Ca3, a resistor Ra2, inductors La3 and La4 and transistors Tra3 and Tra4 is provided.

The transistor Tra3 has its base and collector connected to the control terminal Vcnt via the resistor Rd2. The transistor Tra4 has its base connected to the base of the transistor Tra3 and has its collector to the base of the amplifying transistor Tr via the inductor La3 and the capacitor Ca3. The emitters of the transistors Tra3 and Tra4 are grounded. The inductor La4 is connected between an inductor La3-capacitor Ca3 connection point and the control terminal Vcnt.

The shorting circuit shorts the base of the amplifying transistor Tr in the attenuation mode. This function can be realized in such a manner that a high-level voltage is applied to the control terminal Vcnt to turn on the transistor Tra4 in the attenuation mode and the constants of the capacitor Ca3 and the inductor La3 are set to such values that series resonance of these elements occurs at the desired frequency.

As described above, there is a problem that even in a state where the bias circuit B2 is not supplying the bias current, the amplifying transistor Tr changes from the off state to the on state by its self-biasing when high power is input to the amplifying transistor from the initial-stage power amplifier. This problem can be suppressed by shorting the base of the amplifying transistor Tr in the attenuation mode. In this way, the allowable input power in the attenuating state can be improved. Other effects, which are the same as those of the second embodiment, can also be obtained.

Seventeenth Embodiment

A seventeenth embodiment is a modification of the sixteenth embodiment made by changing the shorting circuit so that the shorting circuit shorts the cathode of the BC diode Da1 in the attenuation mode. In this way, reverse-direction isolation of the input and output of the amplifying transistor Tr in the amplification mode (as to which part of the collector output signal is returned to the base side) can be improved. In a case where the amplifying transistor Tr has a large total emitter area and a high operating frequency, if a deterioration of reverse-direction isolation of the amplifying transistor Tr is caused by addition of the bypass circuit, a reduction in gain or oscillation of the amplifying transistor Tr results. In the present embodiment, this problem can be suppressed. Other effects, which are the same as those of the second embodiment, can also be obtained.

Eighteenth Embodiment

Figure 19:
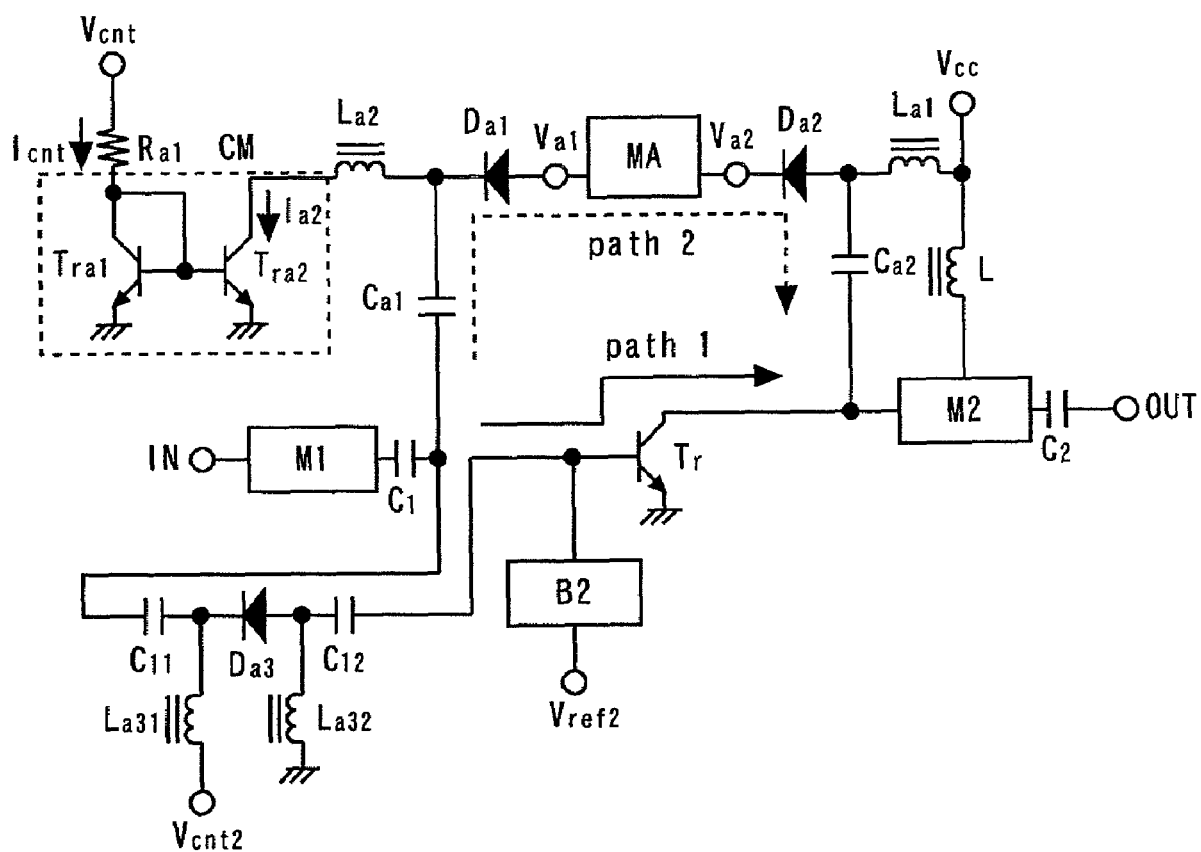
FIG. 19 is a circuit diagram showing a power amplifier according to an eighteenth embodiment of the present invention.
Figure 20:
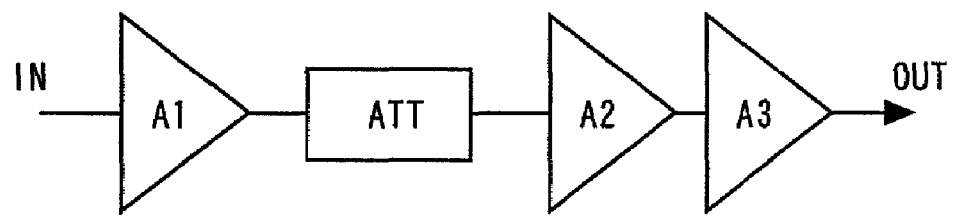
FIG. 20 is a block diagram showing a three-stage power amplifier in which an attenuator having a step attenuation function is inserted in an amplifying stage. amplifier A2.
Figure 21:
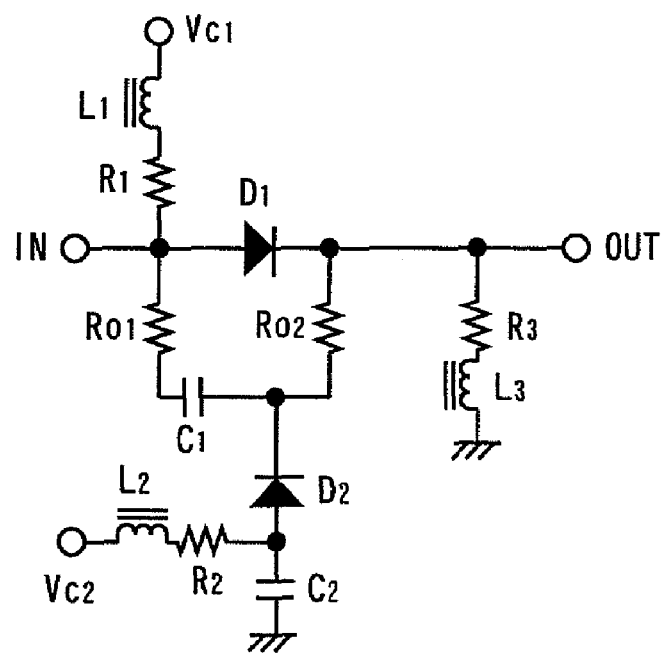
FIG. 21 is a circuit diagram showing an example of a conventional attenuator having a step attenuation function.
Figure 22:
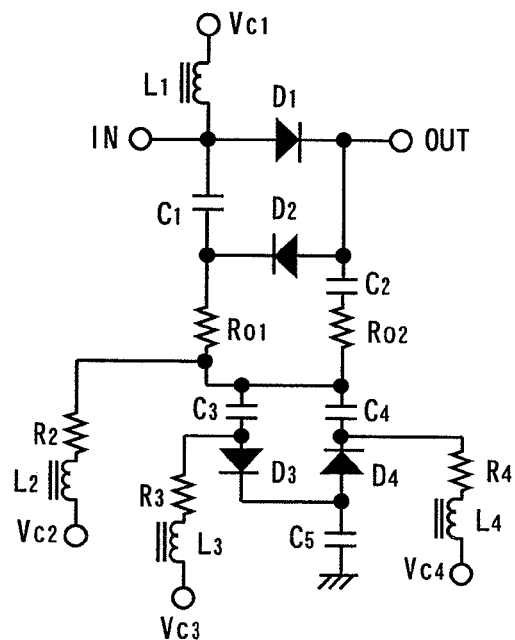
FIG. 22 is a circuit diagram showing another example of a conventional attenuator having a step attenuation function.
Figure 23:
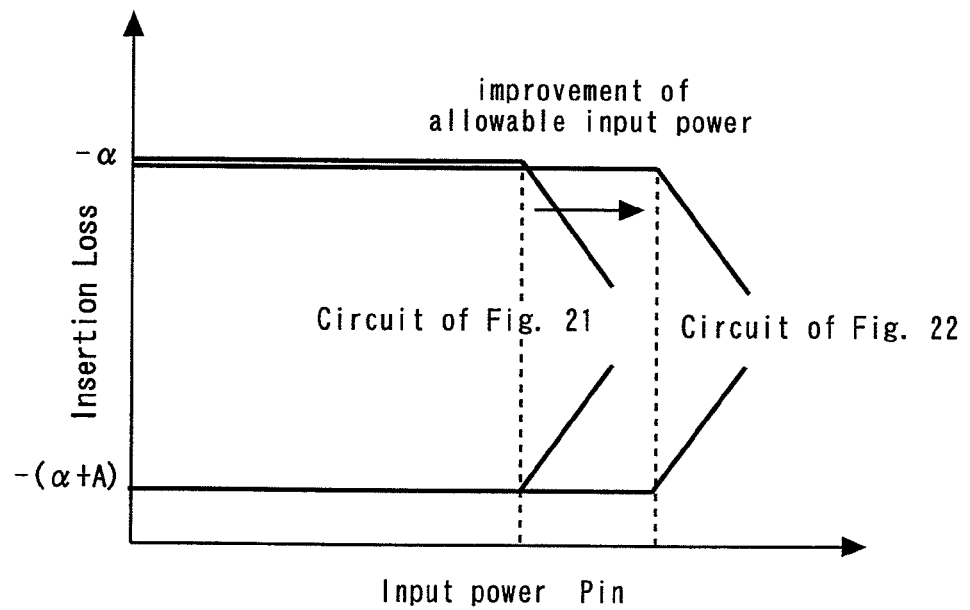
FIG. 23 is a diagram showing power pass characteristics of the attenuators shown in FIGS. 21 and 22.
Figure 24:
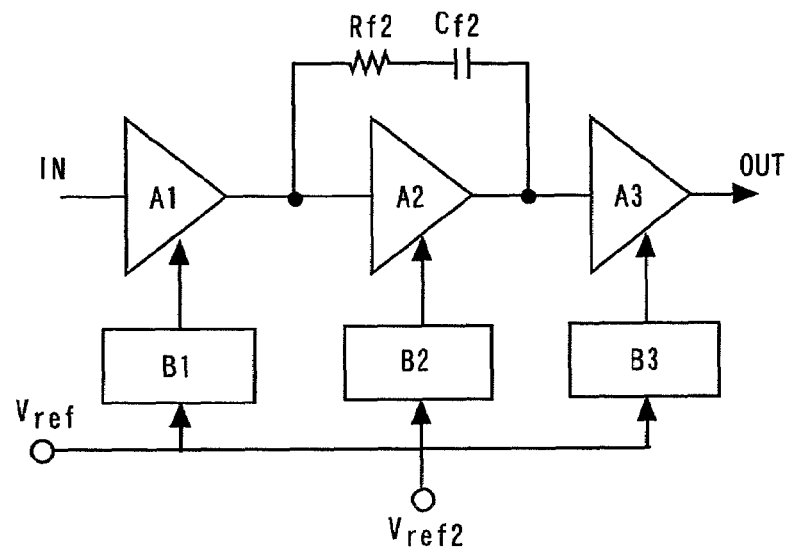
FIG. 24 is a block diagram showing a three-stage power amplifier having a bypass circuit in an amplifying stage.

FIG. 19 is a circuit diagram showing a power amplifier according to an eighteenth embodiment of the present invention. The eighteenth embodiment differs from the second embodiment in that a variable capacitor is provided as the capacitor C1 (first capacitor). That is, capacitors C11 and C12, a diode Da3, inductors La31 and La32 and a control terminal Vcnt2 are provided in place of the capacitor C1.

The cathode of the diode Da3 is connected to the input matching circuit M1 via the capacitor C11 and also connected to the control terminal Vcnt2 via the inductor La31. The anode of the diode Da3 is connected to the base of the amplifying transistor Tr via the capacitor C12 and is grounded via the inductor La32.

In the above-described configuration, the capacitance value of the first capacitor is set higher in the attenuation mode than in the amplification mode. For example, a high-level voltage is applied to the control terminal Vcnt2 in the attenuation mode to reverse-bias the junction capacitance of the diode Da3. In this way, leakage of input power to the amplifying transistor Tr can be suppressed. In a case where the amount of attenuation by the bypass circuit is small, the large input off capacitance of amplifying transistor Tr forms a shorting point with respect to the RF signal and, therefore, attenuation occurs in the input section. This phenomenon makes the design of the bypass circuit complicated. In contrast, in the present embodiment, the circuit design can be easily performed even if the amount of attenuation by the bypass circuit is small. Other effects, which are the same as those of the second embodiment, can also be obtained.

Nineteenth Embodiment

In a nineteenth embodiment of the present invention, a variable capacitor is provided as the capacitor Ca1 (second capacitor) of the second embodiment. The configuration of the variable capacitor is the same as that in the eighteenth embodiment. The capacitance value of the second capacitor is set higher in the amplification mode than in the attenuation mode. For example, 0 V is applied to the control terminal Vcnt2 in the amplification mode to zero-bias the junction capacitance of the diode Da3. In this way, signal leakage to the bypass circuit side in the amplification mode can be suppressed. That is, reverse-direction isolation of the input and output of the amplifying transistor Tr in the amplification mode can be improved. In a case where the amplifying transistor Tr has a large total emitter area and a high operating frequency, if a deterioration of reverse-direction isolation of the amplifying transistor Tr is caused by addition of the bypass circuit, a reduction in gain or oscillation of the amplifying transistor Tr results. In the present embodiment, this problem can be suppressed. Other effects, which are the same as those of the second embodiment, can also be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-000722, filed on Jan. 7, 2008 including specification, claims, drawings and summary, on which the Convention priority of the present application is based, are incorporated herein by reference in its entirety.

What is claimed is:

1. A power amplifier comprising:
an input terminal and an output terminal;
first, second, and third capacitors;
an amplifying transistor having a base connected to the input terminal via the first capacitor and a collector connected to the output terminal, and which amplifies a radio frequency signal;
a bias circuit which supplies a bias current to the base of the amplifying transistor;
a first diode having a cathode connected to the input terminal via the second capacitor, and an anode;
a second diode having an anode connected to the output terminal via the third capacitor, and a cathode;
a matching and attenuating circuit which is connected between the anode of the first diode and the cathode of the second diode, which reduces impedance mismatches on an input terminal side and an output terminal side, and which attenuates the radio frequency signal;
a first inductor connected between the anode of the second diode and a power supply terminal;
a second inductor; and
a current mirror circuit which is connected to the cathode of the first diode via the second inductor, and which drives the first and second diodes, wherein,
in an amplification mode, the bias circuit supplies a bias current to the amplifying transistors and the current mirror circuit turns off the first and second diodes, and
in an attenuation mode, the bias circuit supplies no bias current to the amplifying transistor and the current mirror circuit turns on the first and second diodes.

2. The power amplifier according to claim 1, wherein the matching and attenuating circuit includes a resistor connected between the anode of the first diode and the cathode of the second diode.

3. The power amplifier according to claim 1, including a third inductor, a resistor, and a fourth capacitor, wherein,
in the matching and attenuating circuit, the third inductor is connected between the anode of the first diode and the cathode of the second diode, and
the resistor and the fourth capacitor are connected in series between one end of the third inductor and a grounding point.

4. The power amplifier according to claim 1, wherein each of the first and second diodes comprises a plurality of diodes connected in series.

5. A power amplifier comprising at least two bypass circuits connected in parallel with each other, each bypass circuit including the first and second diodes, the matching and attenuating circuit, and the current mirror circuit according to claim 1.

6. The power amplifier according to claim 1, wherein the cathode of the first diode is connected to a connection point between the input terminal and the first capacitor.

7. The power amplifier according to claim 1, further comprising a fourth capacitor provided between a grounding point and a connection point between the second inductor and the current mirror circuit.

8. The power amplifier according to claim 1, further comprising:
a third diode having an anode connected to the cathode of the first diode and having cathode connected to the anode of the first diode;
a fourth capacitor connected in parallel with the first diode and in series with the third diode;
a fourth diode having an anode connected to the cathode of the second diode and having a cathode connected to the anode of the second diode; and
a fifth capacitor connected in parallel with the second diode and in series with the fourth diode.

9. The power amplifier according to claim 8, further comprising:
a sixth capacitor connected in parallel with the third diode and in series with the first diode; and
a seventh capacitor connected in parallel with the fourth diode and in series with the second diode.

10. The power amplifier according to claim 1, further comprising a transistor having a base and a collector connected to a control terminal and having an emitter connected to the cathode of the first diode, wherein a high-level voltage is applied to the control terminal in the amplification mode and a low-level voltage is applied to the control terminal in the attenuation mode.

11. The power amplifier according to claim 1, further comprising a third diode having an anode connected to a control terminal and a cathode connected to the cathode of the first diode, wherein a high-level voltage is applied to the control terminal in the amplification mode and a low-level voltage is applied to the control terminal in the attenuation mode.

12. The power amplifier according to claim 1, further comprising an input power detection circuit which increases a reference current for the current mirror circuit according to an increase in power of the radio frequency signal input to the amplifying transistor.

13. The power amplifier according to claim 1, further comprising a resistor for producing a reference current for the current mirror circuit, the resistance of the resistor increasing with an increase in temperature.

14. The power amplifier according to claim 1, further comprising a shorting circuit which short-circuits the base of the amplifying transistor in the attenuation mode.

15. The power amplifier according to claim 1, wherein the first capacitor is a variable capacitor and capacitance of the first capacitor is larger in the attenuation mode than in the amplification mode.

16. The power amplifier according to claim 1, wherein the second capacitor is a variable capacitor and capacitance of the second capacitor is larger in the amplification mode than in the attenuation mode.

* * * * *